United States Patent
Kamiya

(10) Patent No.: US 8,205,142 B2
(45) Date of Patent: Jun. 19, 2012

(54) ERROR CORRECTION CODING METHOD AND DEVICE

(75) Inventor: Norifumi Kamiya, Minato-ku (JP)

(73) Assignee: NEC Corporation, Tokyo (JP)

( * ) Notice: Subject to any disclaimer, the term of this patent is extended or adjusted under 35 U.S.C. 154(b) by 890 days.

(21) Appl. No.: 12/300,412

(22) PCT Filed: Apr. 25, 2007

(86) PCT No.: PCT/JP2007/058972
§ 371 (c)(1),
(2), (4) Date: Nov. 11, 2008

(87) PCT Pub. No.: WO2007/132656
PCT Pub. Date: Nov. 22, 2007

(65) Prior Publication Data
US 2009/0187810 A1    Jul. 23, 2009

(30) Foreign Application Priority Data
May 12, 2006    (JP) .................................. 2006-134092

(51) Int. Cl.
*G06F 11/00*    (2006.01)
(52) U.S. Cl. ........................................ 714/781; 714/752

(58) Field of Classification Search ........................ None
See application file for complete search history.

(56) References Cited

U.S. PATENT DOCUMENTS

| 7,865,806 | B2* | 1/2011 | Lablans | 714/781 |
| 2007/0300135 | A1* | 12/2007 | Kamiya | 714/781 |

FOREIGN PATENT DOCUMENTS

RU    2073913 C1    2/1997

* cited by examiner

*Primary Examiner* — Michael Maskulinski
(74) *Attorney, Agent, or Firm* — Sughrue Mion, PLLC

(57) ABSTRACT

An error correction coding method using a low-density parity-check code includes: dividing an information bit sequence to be processed for error correction coding, into (m−r) pieces of first blocks each comprising a bit sequence having a length n and r pieces of second blocks comprising respective bit sequences having lengths $k_1, k_2, \ldots, k_r$; a first arithmetic operation for performing polynomial multiplication on the (m−r) pieces of first blocks, and outputting r pieces of bit sequences having a length n; and a second arithmetic operation for performing a polynomial division and a polynomial multiplication on the r pieces of second blocks and r pieces of operation results of the first arithmetic operation, and outputting a bit sequence including redundant bit sequences having respective lengths $n-k_1, n-k_2, \ldots, n-k_r$.

21 Claims, 7 Drawing Sheets

ERROR CORRECTION CODING METHOD AND DEVICE

TECHNICAL FIELD

The present invention relates to a block error correction coding method and device for dividing an information sequence into blocks of a certain length and independently adding a redundant sequence to each of the blocks, and more particularly to a method of and a device for low-density parity-check (LDPC) coding.

BACKGROUND ART

Communication systems such as satellite or mobile communication systems have incorporated therein the error correction coding technology with a large coding gain to meet system requirements for power reduction and small antenna size. A low-density parity-check code is known as an error correcting code having a very large coding gain. The introduction of the low-density parity-check code into various communication systems and storage devices such as magnetic storage devices is presently in progress.

A low-density parity-check coding scheme does not refer to a single error correction coding scheme, but refers to a general term for error correcting codes which are characterized in that they are defined by a sparse check matrix. The sparse check matrix means that most of the components (elements) of the check matrix are "0" and the number of components "1" is very small. As disclosed in D. J. C. Mackay, "Good Error-Correcting Codes Based on very sparse matrices," IEEE Transactions on Information Theory, pp. 399-431, March 1999 (Non-patent literature 1), the low-density parity-check code is characterized in that it can provide an error correction coding scheme having a very large coding gain close to the theoretical limitation, by employing a repetitive decoding scheme such as a sum-product algorithm based on the selection of a sparse check matrix.

One technical problem with the low-density parity-check code is that it requires a large amount of calculations for a coding process, i.e., a process of calculating a redundant bit sequence from a information bit sequence. In a most typical coding device wherein generation of a redundant bit sequence comprises multiplying calculation of matrices by a code generator matrix, the generation of a low-density parity-check code sequence requires a number of exclusive-ORing operations which is proportional to the square of the code length.

If a coding device comprises a code check matrix, then a check matrix is basically deformed such that a portion of the check matrix becomes a diagonal matrix, as shown by equation (1), and the generation of a low-density parity-check code sequence is realized by the basically deformed check matrix.

$$A \left( \left. \begin{matrix} 1 & & & 0 \\ & 1 & & \\ & & \ddots & \\ 0 & & & 1 \end{matrix} \right| \right) \quad (1)$$

Specifically, if it is assumed that r and k represent positive integers, i an integer in the range of $1 \leq i \leq r$, A in equation (1) an r×k matrix, and $c_1, c_2, \ldots, c_k$ an information bit sequence of k bits, then each bit $p_i$ of corresponding redundant bit sequence $p_1, p_2, \ldots, p_r$ is calculated according to following equation (2):

$$p_i = \sum_{j=1}^{k} a_{i,j} c_j = a_{i,1} c_1 + a_{i,2} c_2 + \ldots + a_{i,k} c_k \quad (2)$$

where j represents an integer in the range of $1 \leq j \leq k$ and $a_{i,j}$ an (i,j) component of r×k matrix A. In order to carry out coding of an error correcting code, it is necessary to store r×k matrix A in a storage device such as a memory and perform as many exclusive-ORing operations as the number of values "1" in the components of matrix A.

FIG. 1 shows an example of the arrangement of a coding device according to the related art for performing coding by a low-density parity-check code. When the illustrated coding device is given an information bit sequence, it codes the information bit sequence with a low-density parity-check code and outputs a code bit sequence. The coding device comprises redundant bit sequence calculating device 71 for performing the calculation according to equation (2) on the information bit sequence to generate a redundant bit sequence, matrix information storage memory 72 for holding matrix A shown in equation (1) and supplying the components (elements) of matrix A to redundant bit sequence calculating device 71, and switch 73 for selecting, one at a time, the information bit sequence and the redundant bit sequence from redundant bit sequence calculating device 71, for thereby producing a code bit sequence which comprises a combination of the information bit sequence and the redundant bit sequence. Redundant bit sequence calculating device 71 includes exclusive-ORing circuits.

For reducing the storage capacity of the storage device (i.e., matrix information storage memory 72) and reducing the number of exclusive-ORing circuits included in redundant bit sequence calculating device 71, there is known a process of constructing a low-density parity-check code such that the number of "1" in the components of matrix A is as small as possible and a coding gain achieved by repetitive decoding is preferably large. Such a constructing process is disclosed in, for example, Thomas Richardson, R. Urbanke, "Efficient Encoding of Low-Density Parity-Check Codes," IEEE Transactions on Information Theory, pp. 619-656, September 2001 (Non-patent literature 2). JP-2003-115768A (Patent literature 1) and JP-2004-72130A (Patent literature 2) disclose a process of using a matrix comprising block matrices of a cyclic permutation matrix as a check matrix and limiting each of the block matrices to a cyclic matrix for thereby reducing the storage capacity and simplifying exclusive-ORing operations. A check matrix that is limited in such a manner is specifically referred to as a pseudo-cyclic code. These processes still have a problem in that the reduced apparatus scale and the simplified processing are incompatible. In other words, the processes using the pseudo-cyclic codes require complicated control though the apparatus scale is reduced, or are applicable to further restricted codes among pseudo-cyclic codes, i.e., only codes to which additional restrictive conditions are added.

For the progress of the application of error correction coding to various communication systems and storage devices such as magnetic storage devices, it has been desirable to develop a coding scheme for improving a coding gain obtained by repetitive decoding according to the sum-product algorithm, in addition to a small-scale apparatus for performing a simple coding process.

Patent literature 1: JP-2003-115768A
Patent literature 2: JP-2004-72130A

Non-patent literature 1: D. J. C. Mackay, "Good Error-Correcting Codes Based on very sparse matrices," IEEE Transactions on Information Theory, pp. 399-431, March 1999

Non-patent literature 2: Thomas Richardson, R. Urbanke, "Efficient Encoding of Low-Density Parity-Check Codes," IEEE Transactions on Information Theory, pp. 619-656, September 2001

DISCLOSURE OF THE INVENTION

Problems to be Solved by the Invention

Since coding regarding a low-density parity-check code is realized using a storage device such as a matrix information storage memory for holding matrix A in equation (1) described above and a processor such as a redundant bit sequence calculating device for carrying out the processing operation according to equation (2) described above, the coding device is of a very large scale compared with the case of cyclic coding with a Reed-Solomon code or convolutional coding. Because of this problem, if the error correction coding according to the above related art is applied to systems such as satellite communication systems, terrestrial microwave communication systems, and mobile communication systems, then it is difficult to make a simple encoding process and a reduced apparatus scale, and an increased encoding gain compatible with each other.

It is an object of the present invention to provide an error correction coding method based on low-density parity-check coding, which makes an error correction coding device small in scale and simple in arrangement, and which can achieve a large coding gain based on repetitive decoding.

Another object of the present invention to provide an error correction coding device based on low-density parity-check coding, which is small in scale and simple in arrangement, and which can achieve a large coding gain based on repetitive decoding.

Means for Solving the Problems

An error correction coding method according to the present invention, which uses a low-density parity-check code, includes: dividing an information bit sequence having a length K to be processed for error correction coding, into (m−r) pieces of first blocks each comprising a bit sequence having a length n and r pieces of second blocks comprising respective bit sequences having lengths $k_1, k_2, \ldots, k_r$, where K, m, n are positive integers, r an integer in the range of $1 \leq r \leq m$, and $k_1, k_2, \ldots, k_r$ integers in the range of $0 \leq k_1, k_2, \ldots, k_r \leq n-1$; a first arithmetic operation for performing polynomial multiplication on the (m−r) pieces of first blocks, and outputting r pieces of bit sequences having a length n; and a second arithmetic operation for performing a polynomial division and a polynomial multiplication on the r pieces of second blocks and r pieces of the operation results of the first arithmetic operation, and outputting a bit sequence including redundant bit sequences having respective lengths $n-k_1$, $n-k_2$, $n-k_r$.

An error correction coding device according to the present invention, which uses a low-density parity-check code, includes: a divider for dividing an information bit sequence having a length K to be processed for error correction coding, into (m−r) pieces of first blocks each comprising a bit sequence having a length n and r pieces of second blocks comprising respective bit sequences having lengths $k_1, k_2, \ldots, k_r$, where K, m, n are positive integers, r an integer in the range of $1 \leq r \leq m$, and $k_1, k_2, \ldots, k_r$ integers in the range of $0 \leq k_1, k_2, \ldots, k_r \leq N-1$; r pieces of first arithmetic processors for performing polynomial multiplication on the (m−r) pieces of first blocks, and each outputting a bit sequences having a length n as an operation result; and a second arithmetic processor for performing a polynomial division and a polynomial multiplication on the r pieces of second blocks and the operation results respectively supplied in parallel from the r pieces of the first arithmetic processors, and outputting a bit sequence including redundant bit sequences having respective lengths $n-k_1, n-k_2, \ldots, n-k_r$.

In the error correction coding device according to the present invention, each of the first arithmetic processors may include, for example, a maximum of (m−r) pieces of polynomial multiplying circuits. For example, the second arithmetic processor may include: a first polynomial dividing and multiplying unit for concurrently performing at most a single polynomial division and at most (r−1) polynomial multiplications on the second block having the length $k_r$ and the operation results from the r pieces of the first arithmetic processors, and outputting $(n-k_r)$ bits and (r−1) pieces of bit sequences having the length n of the redundant bit sequences; and a p-th polynomial dividing and multiplying unit, where p is an integer in the range of $2 \leq p \leq r$, for concurrently performing at most a single polynomial division and at most (r−p) polynomial multiplications on (r−p+1) pieces of bit sequences having the length n delivered from a (p−1)-th polynomial dividing and multiplying unit and the second block having a length $k_{r-p+1}$, and outputting $(n-k_{r-p+1})$ bits and (r−p) pieces of bit sequences having the length n of the redundant bit sequences. In this case, for example, the r-th polynomial dividing and multiplying unit may include at most a single polynomial dividing circuit and at most (r−q) pieces of polynomial multiplying circuits where q is an integer in the range of $1 \leq q \leq r$.

Such a polynomial dividing and multiplying unit may employ connection logic states, for example, for establishing a polynomial to serve as a divisor in the polynomial dividing circuit and a polynomial for determining multipliers in the polynomial multiplying circuits. In this case, there may be employed a series of polynomials associated with minimum polynomials on a prime field of elements of a finite field as a maximum of r pieces of polynomials corresponding to connections in the polynomial dividing circuit, and the polynomials corresponding to the connections in the polynomial dividing circuit may be selected such that a matrix provided by a product polynomial with a product of a polynomial corresponding to polynomial dividing device will be a sparse matrix. With the polynomials being thus employed and selected, the coding gain can be increased for efficient processing operation.

According to the present invention, there is provided a coding method and device based on a low-density parity-check code, which is characterized by a small device scale and a simple device arrangement, and which is capable of achieving a high coding gain according to a repetitive decoding scheme.

DESCRIPTION OF REFERENCE CHARACTERS

11 Polynomial multiplying unit,
12 Polynomial dividing and multiplying unit,
13, 14, 23, 34, 54, 55, 65, 73 Switches,
21, 42 Polynomial multiplying circuits,
22, 32, 43, 52, 62 Exclusive-OR circuits,
31, 51, 61 Flip-flops,
33, 53, 63 Connecting elements,
41 Polynomial dividing circuit,
44 Selector,
45, 46 Input terminals,
47, 48 Output terminals,
65 Serial-to-parallel converter,
71 Redundant bit sequence calculating device,
72 Matrix information storage memory,
81 Data transmitting apparatus,
82 Coding device,
83, 87 Synchronous control and data converting devices,
84 Modulator,
85 Data receiving apparatus,
86 Demodulator,
88 Decoding device.

BEST MODE FOR CARRYING OUT THE INVENTION

Figure 2:
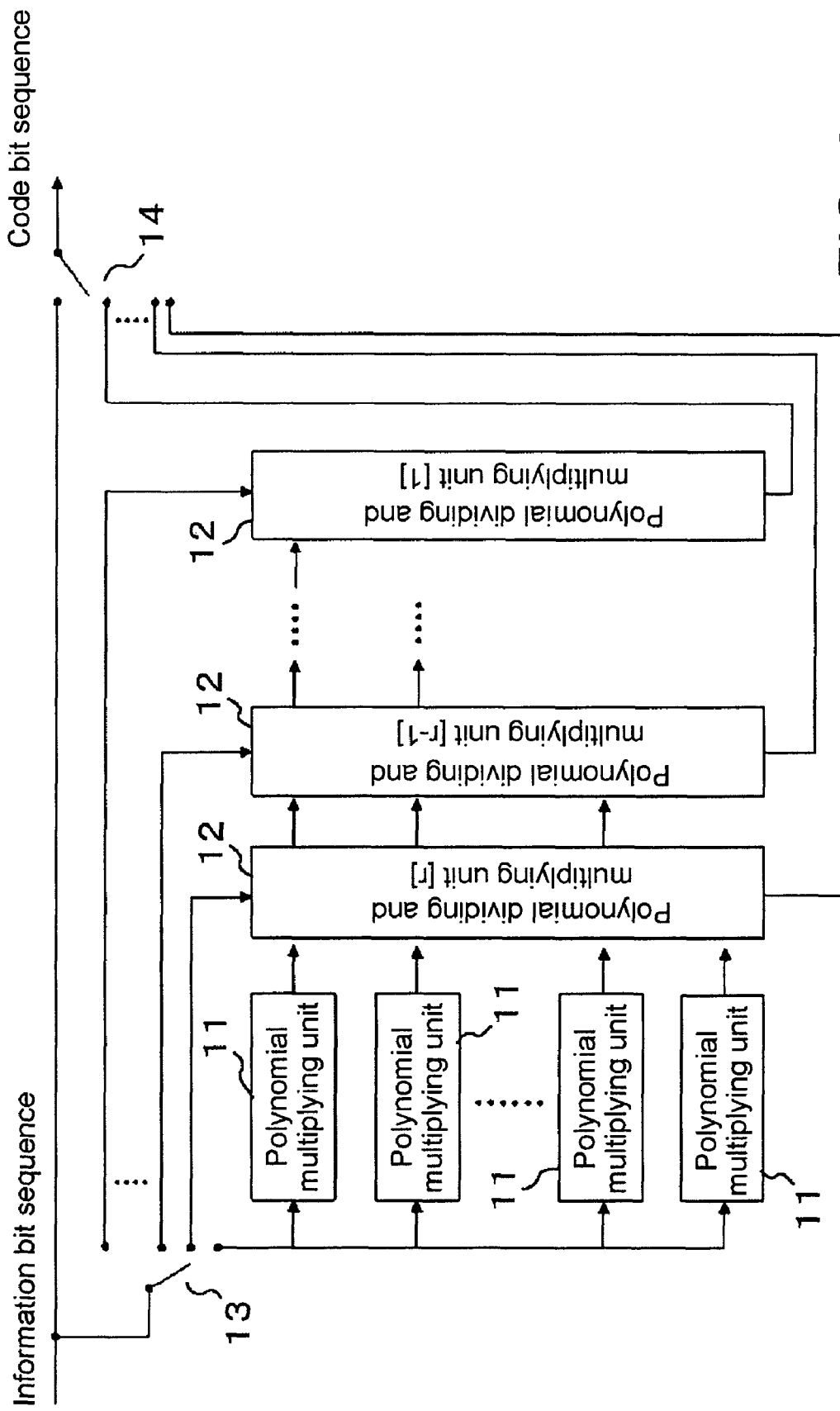
FIG. 2 is a block diagram showing the arrangement of an error correction coding device according to an exemplary embodiment of the present invention.

An error correction coding device according to an exemplary embodiment of the present invention shown in FIG. 2 performs error correction encoding based on a low-density parity-check code on an information bit sequence supplied as an input for thereby generating a code bit sequence. The error correction coding device includes: r pieces of polynomial multiplying units 11 arranged in parallel, where r represents an integer of 1 or greater; r pieces of polynomial dividing and multiplying units 12 arranged in series; switch 13 on an input side, and switch 14 on an output side. In order to distinguish r pieces of arranged polynomial dividing and multiplying units 12 from each other, they are denoted by "[1]" to "[r]" as described later. Switch 13 serves to assign an information bit sequence supplied to the error correction coding device to either one of polynomial multiplying units 11. Switch 14 serves to successively selecting the information bit sequence and r pieces of outputs from polynomial dividing and multiplying unit [1] in the final stage in order to output a code bit sequence in which the information bit sequence and a redundant bit sequence are combined, as described later.

A coding scheme in the present exemplary embodiment is supplied with an input represented by an information bit sequence having a length represented by K bits and outputs a code bit sequence having a length represented by n·m bits. Here, the bit length K of the information bit sequence is expressed by the following equation:

$$K = n(m - r) + \sum_{i=1}^{r} k_i \tag{3}$$

K bits in the code bit sequence having a bit length n·m are in complete agreement with the input information bit sequence having a bit length K. Therefore, the coding scheme in the present exemplary embodiment is a systematic coding scheme. Details of the arrangement of the error correction coding device according to the exemplary embodiment will be described below. Unless otherwise indicated, a length represents a bit length in the description below.

Figure 3:
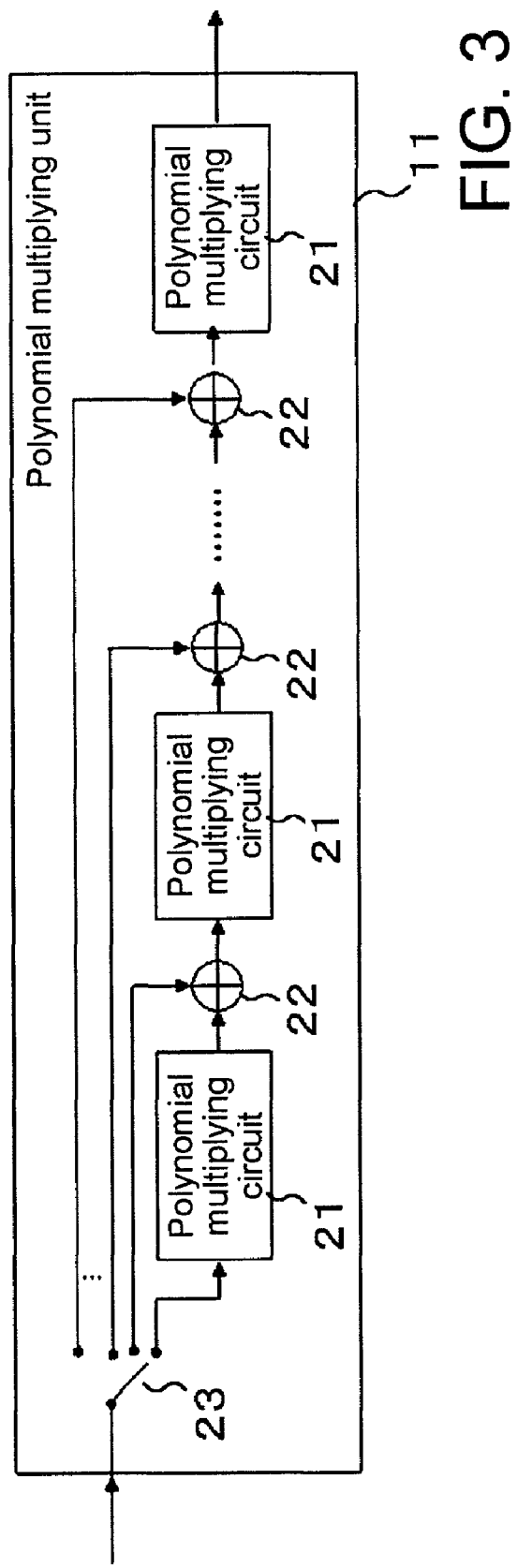
FIG. 3 is a block diagram showing an example of the arrangement of a polynomial multiplying unit.

Polynomial multiplying units 11, r pieces of which are arranged, are identical in arrangement to each other, and each includes, as shown in FIG. 3, at most (m−r) pieces of polynomial multiplying circuits 21, exclusive-OR circuits 22 which are one fewer than polynomial multiplying circuits 21, and switch 23. Polynomial multiplying circuits 21, (m−r) pieces of which are arranged, are connected in series with each other by exclusive-OR circuits 22. Switch 23 is a one-input, (m−r)-output switch, and supplies an input information bit sequence to first polynomial multiplying circuit 21, i.e., polynomial multiplying circuit 21 on the left end in FIG. 3, or either one of (m−r−1) pieces of exclusive-OR circuits 22. An output from final polynomial multiplying circuit 21, i.e., polynomial multiplying circuit 21 on the right end in FIG. 3, is supplied as an output of polynomial multiplying unit 11 to polynomial dividing and multiplying unit 12 at a subsequent stage.

Polynomial multiplying unit 11 receives n(m−r) bits as an input among the information bits having the length K as indicated by equation (2), and outputs a bit sequence having a length n. The output bit sequence is supplied to polynomial dividing and multiplying unit 12 at the subsequent stage. The bit sequence having the length n(m−r) is divided into segments each comprising n bits, which are distributed to (m−r) pieces of polynomial multiplying circuits 21 by switch 23. For example, first to n-th bits are sequentially supplied to first polynomial multiplying circuit 21, i.e., polynomial multiplying circuit 21 on the left end as shown, and (n+1)-th to 2n-th bits are sequentially supplied via exclusive-OR circuit 22 to second polynomial multiplying circuit 21, i.e., second polynomial multiplying circuit 21 from the left end as shown. Similarly, (jn+1)-th to (j+1)n-th bits where j is an integer in the range of $2 \leq j \leq m-r-1$ are sequentially supplied via j-th exclusive-OR circuit 22 to (j+1)-th polynomial multiplying circuit 21.

Figure 4:
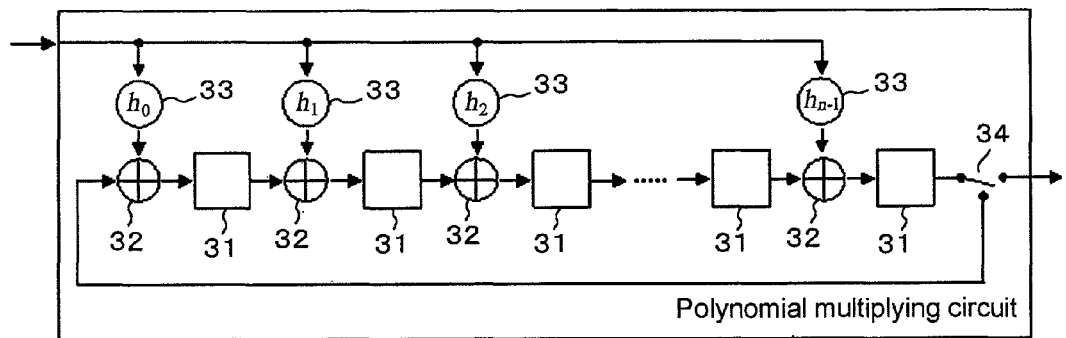
FIG. 4 is a block diagram showing an example of the arrangement of a polynomial multiplying circuit.

Polynomial multiplying circuits 21 in each of polynomial multiplying units 11 are identical in arrangement to each other. As shown in FIG. 4, polynomial multiplying circuit 21 comprises n pieces of flip-flops 31 used as registers where n is a positive integer, at most n pieces of exclusive-OR circuits 32, connecting elements 33 associated respectively with exclusive-OR circuits 32 for being supplied with the bit sequence supplied to polynomial multiplying circuit 21, and switch 34. Connecting elements 33 having their connected or unconnected state determined depending on the check matrix. Exclusive-OR circuits 32 are disposed at the respective input sides of flip-flops 31. Through exclusive-OR circuits 32, n pieces of flip-flops 31 that are associated with respective exclusive-OR circuits 32 are connected in series with each other. Switch 34 is connected to the output of flip-flop 31 at a final stage. Switch 34 serves to selectively supply an output from flip-flop 31 at the final stage as an output of polynomial multiplying circuit 21 to the outside, or return the output from flip-flop 31 at the final stage to first flip-flop 31, i.e., flip-flop 31 on the left end in FIG. 4, through exclusive-OR circuit 32 at the first stage.

Polynomial multiplying circuit 21 is thus of an n-bit-input, n-bit-output configuration. When the output from flip-flop 31 at the final stage is supplied to flip-flop 31 at the first stage by switch 34, polynomial multiplying circuit 21 is sequentially supplied with an input bit sequence of n bits. When polynomial multiplying circuit 21 has been supplied with all the bits, it operates switch 34 to successively output the data of n pieces of flip-flops 31, (i.e., the registers). As shown in FIG. 4, n pieces of connecting elements 33 correspond respectively to a predetermined bit sequence $h_0, h_1, \ldots, h_{n-1}$ of n bits, and are set to a connected state or unconnected state depending on whether the corresponding bit is "1" or "0." The connected state is a state in which the input bit sequence to polynomial multiplying circuit 21 is supplied through connecting elements 33 to exclusive-OR circuits 32. The unconnected state is a state in which the input bit sequence to polynomial multiplying circuit 21 is not supplied to exclusive-OR circuits 32. If j is an integer in the range of $0 \leq j \leq n-1$, then when $h_j$ is 1, the connecting element marked "$h_j$" is in the connected state, and when $h_j$ is 0, the connecting element marked "$h_j$" is in the unconnected state. In this manner, polynomial multiplying circuit 21 performs a polynomial multiplication with a polynomial having coefficients represented by a bit sequence $h_0, h_1, \ldots, h_{n-1}$ of n bits. An example of a selecting method for the bit sequence $h_0, h_1, \ldots, h_{n-1}$ will be described later.

In order to distinguish r pieces of polynomial dividing and multiplying units 12 with each other, which are connected in series, these polynomial dividing and multiplying units are denoted by "[1]" to "[r]." As shown in FIG. 2, the polynomial dividing and multiplying unit on the input side, i.e., the side of polynomial multiplying unit 11, is expressed as polynomial dividing and multiplying unit [r], and the polynomial dividing and multiplying unit disposed at the output polynomial dividing and multiplying unit [r] is expressed as polynomial dividing and multiplying unit [r−1]. Similarly, the polynomial dividing and multiplying unit on the right end in FIG. 2 is expressed as polynomial dividing and multiplying unit [1].

Figure 5:
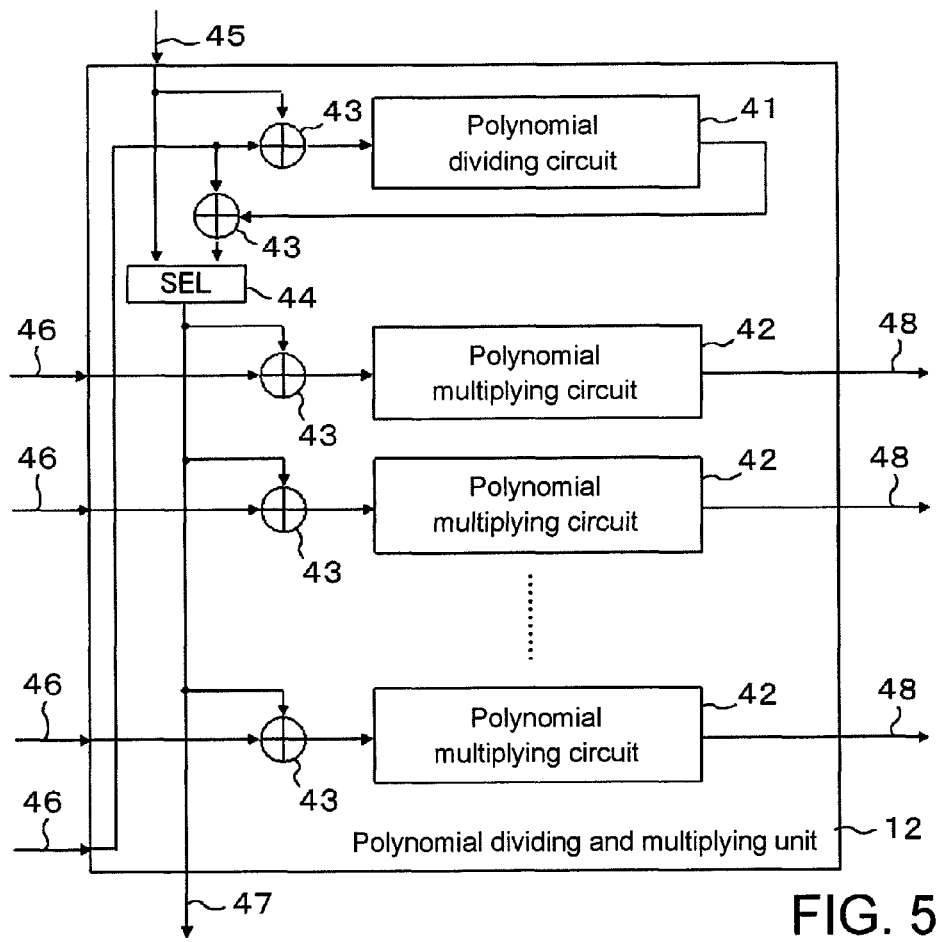
FIG. 5 is a block diagram showing an example of the arrangement of a polynomial dividing and multiplying unit.

If i is an integer in the range of $1 \leq i \leq r$, then polynomial dividing and multiplying unit [i] among polynomial dividing and multiplying units 12 comprises, as shown in FIG. 5, at most one polynomial dividing circuit 41 and at most (i−1) pieces of polynomial multiplying circuits 42. Polynomial multiplying circuits 42 may be the same as the polynomial multiplying circuit shown in FIG. 4. Polynomial dividing circuit 41 will be described later.

Serially disposed r pieces of polynomial dividing and multiplying units 12 include different numbers of polynomial multiplying circuits depending on their positions in the series-connected array. Accordingly, each of the polynomial dividing and multiplying units is identified by the number of polynomial multiplying circuits thereof. In the coding device shown in FIG. 2, polynomial dividing and multiplying unit [r] includes (r−1) or less pieces of polynomial multiplying circuits 42, and polynomial dividing and multiplying unit [r−1] includes (r−2) or less pieces of polynomial multiplying circuits 42. As described above, polynomial dividing and multiplying unit [i] includes (i−1) or less pieces of polynomial multiplying circuits 42. If the multiplication of a zero polynomial is taken into account, then since it is not necessary to provide a multiplying circuit for multiplying a zero polynomial, polynomial dividing and multiplying unit [i] includes (i−1) polynomial multiplying circuits 42. Polynomial dividing and multiplying unit [i] will be described below.

Polynomial dividing and multiplying unit [i] comprises, in addition to at most one polynomial dividing circuit 41 and at most (i−1) pieces of polynomial multiplying circuits 42, two exclusive-OR circuits 43 associated with polynomial dividing circuit 41 and exclusive-OR circuits 43 associated with respective polynomial multiplying circuits 42, selector (SEL) 44, terminal 45 for being supplied with an information bit sequence from switch 13 (see FIG. 2), i pieces of terminals 46 for being supplied with bit sequences in parallel from polynomial dividing and multiplying unit [i+1] at the preceding stage, terminal 47 for supplying a bit sequence to switch 14 (see FIG. 2), and (i−1) pieces of terminals 48 for outputting bit sequences in parallel to polynomial dividing and multiplying unit [i−1] at the subsequent stage. Of i pieces of terminals 46, the first (i−1) pieces of terminals are connected through exclusive-OR circuits 43 to respective polynomial multiplying circuits 42. Output terminals of polynomial multiplying circuits 42 are connected to respective terminals 48. These exclusive-OR circuits 43 are supplied with a common output from selector 44.

The output of selector 44 is also connected to terminal 47. Of terminals 46, remaining one terminal 46 is connected to remaining two exclusive-OR circuits 43. One of these exclusive-OR circuits 43 is supplied with the bit sequence from terminal 45, and is connected to the input of polynomial dividing circuit 41. Other exclusive-OR circuit 43 is supplied with an output bit sequence from polynomial dividing circuit 41, and is connected to one of input terminals of selector 44. The other input terminal of selector 44 is connected to terminal 45.

When i=r, i.e., in polynomial dividing and multiplying unit [r], r pieces of terminals 46 are connected to the respective output terminals of r pieces of polynomial multiplying units 11. When i=1, i.e., in polynomial dividing and multiplying unit [1], polynomial multiplying circuits 42 and terminals 48 are dispensed with.

Polynomial dividing and multiplying unit [i] as described above is supplied with $k_i$ bits among the information bits having the length K indicated by equation (2) through terminal 45 and also with parallel sets of i bits among n·i bits from polynomial dividing and multiplying unit [i+1] at the preceding stage through terminals 46. When i=r, terminals 46 are supplied with respective bits of the outputs from the r pieces of polynomial multiplying units. Polynomial dividing and multiplying unit [i] outputs a bit sequence having a length n as a portion of a coding bit sequence from terminal 47, and also outputs in parallel a total of n(i−1) bits of the bit sequence having the length n from the (i−1) pieces of polynomial multiplying circuits through terminals 48. Polynomial dividing circuit 41 receives an input produced by exclusive-ORing the $k_i$ bits sequentially supplied from terminal 45 and former $k_i$ bits of the n bits sequentially supplied from terminal 46, and sequentially outputs (n−$k_i$) bits after polynomial dividing circuit 41 has received the input. The output of (n−$k_i$) bits from polynomial dividing circuit 41 and latter (n−$k_i$) bits of the n bits sequentially supplied from terminal 46 are exclusive-ORed into an output that is supplied through selector 44 to the inputs of polynomial multiplying circuits 42. Selector 44 receives a first input represented by $k_i$ bits sequentially supplied from terminal 45 and a second input produced by exclusive-ORing the output from the polynomial dividing circuit and latter (n−$k_i$) bits of the n bits sequentially supplied from terminal 46, selectively switches the first and second inputs, and sequentially outputs a total of n bits. The n bits that are delivered from selector 44 are delivered as n bits among the n·m bits of a coding bit sequence through terminal 47. Polynomial multiplying circuits 42 receive inputs produced by exclusive-ORing the output from selector 44 and the n bits sequentially supplied to terminals 46, and sequentially deliver the multiplication result of n bits through terminals 48.

It is assumed that i is an integer in the range of $1 \leq i \leq r$ as described above, and polynomial dividing circuit 41 in polynomial dividing and multiplying unit [i] will be described below with reference to FIG. 6.

Polynomial dividing circuit 41 comprises $(n-k_i)$ pieces of flip-flops 51 where $k_i$ is an integer in the range of $0 \leq k_i \leq n$, at most $(n-k_i)$ pieces of exclusive-OR circuits 52, $(n-k_i+1)$ pieces of connecting elements 53, and switches 54, 55. The $(n-k_i+1)$ pieces of connecting elements 53 correspond respectively to the bits of a bit sequence $g_0, g_1, \ldots, g_{n-ki}$ having a predetermined length of $(n-k_i+1)$ bits, and are set to a connected state or unconnected state depending on the values of the corresponding bits. Specifically, if j is an integer in the range of $0 \leq j \leq n-k_i$, then (j+1)-th connecting element 53, i.e., the connecting element marked "$g_j$" in the figure, is in the connected state when bit $g_j$ is 1, and in the unconnected state when bit $g_j$ is 0. The $(n-k_i)$ pieces of flip-flops 51 are connected in series with each other through exclusive-OR circuits 52 each interposed between adjacent ones of flip-flops 51. Switch 54 serves to selectively supply an output from flip-flop 51 at the final stage as an output of polynomial dividing circuit 41 to the outside, or supply the output from flip-flop 51 at the final stage to remaining one exclusive-OR circuit 52, i.e., final exclusive-OR circuit 52.

Final exclusive-OR circuit 52 is supplied with the bit sequence which is supplied to polynomial dividing circuit 41, and the output of final exclusive-OR circuit 52 is supplied through switch 55 to $(n-k_i+1)$-th connecting element 53, i.e., the connecting element corresponding to bit $g_{n-ki}$. First flip-flop 51, i.e., flip-flop 51 on the right end in FIG. 6, is supplied with an output from connecting element 53 corresponding to bit $g_{n-ki}$ through connecting element 53 corresponding to bit $g_0$. In remaining flip-flops 51, exclusive-OR circuits 52 arrange in the input portions thereof are supplied with the output from connecting element 53 corresponding to bit $g_{n-ki}$ through respective connecting elements 53 corresponding to bits $g_1, \ldots, g_{n-ki-1}$.

Such polynomial dividing circuit 41 receives a sequential input of $k_i$ bits when switch 54 is set to final exclusive-OR circuit 52 side, shifts switch 54 after it has received the sequential input, and sequentially outputs a total of $(n-k_i)$ bits that are stored in the $(n-k_i)$ pieces of flip-flops. In other words, polynomial dividing circuit 41 performs a polynomial division on an input bit sequence of k bits and a polynomial having coefficients represented by the bits of a bit sequence $g_0, g_1, \ldots, g_{n-ki}$ of $(n-k_i+1)$ bits. An example of a selecting method for the bit sequence $g_0, g_1, \ldots, g_{n-ki}$ will be described later.

A check matrix corresponding to the error correction coding device shown in FIG. 2 will be described below. The check matrix is expressed by equation (4):

$$H = \begin{pmatrix} H_{1,1} & H_{1,2} & H_{1,3} & \ldots & H_{1,m-r} & F_{1,r} & \ldots & F_{1,3} & F_{1,2} & G_1 \\ H_{2,1} & H_{2,2} & H_{2,3} & \ldots & H_{2,m-r} & F_{2,r} & \ldots & F_{2,3} & G_2 & \\ H_{3,1} & H_{3,2} & H_{3,3} & \ldots & H_{3,m-r} & F_{3,r} & \ldots & G_3 & & \\ \vdots & \vdots & \vdots & & \vdots & \vdots & \iddots & & & 0 \\ H_{r,1} & H_{r,2} & H_{r,3} & \ldots & H_{r,m-r} & G_r & & & & \end{pmatrix} \quad (4)$$

The check matrix according to equation (4) is an r×m block matrix and has components each comprising an n×n cyclic matrix. The lower right triangular portion of equation (4), i.e., the portion indicated by "0" in bold in the equation, comprises n×n cyclic matrixes which are zero matrixes. As indicated by equation (5) below, an n×n cyclic matrix has a second row vector equal to a first row vector that is shifted one bit to the right and a k-th column vector equal to the first row vector that is shifted (k−1) bits to the right where k is an integer in the range of $2 \leq k \leq n$.

$$\begin{pmatrix} a_0 & a_1 & a_2 & \ldots & a_{n-1} \\ a_{n-1} & a_0 & a_1 & \ldots & a_{n-2} \\ a_{n-2} & a_{n-1} & a_0 & \ldots & a_{n-3} \\ \vdots & \vdots & \vdots & \ddots & \vdots \\ a_1 & a_2 & a_3 & \ldots & a_0 \end{pmatrix} \quad (5)$$

The first row vector of n×n cyclic matrix of equation (5) can be expressed as a polynomial of (n−1)-th order or less as shown in equation (6).

$$a_0 + a_1 x + a_2 x^2 + \ldots + a_{n-1} x^{n-1} \quad (6)$$

It is assumed that i is an integer in the range of $1 \leq i \leq r$, j is an integer in the range of $1 \leq j \leq m-r$, v is an integer in the range of $2 \leq v \leq r$, and u is an integer in the range of $1 \leq u \leq t-1$. The first row vector of $H_{i,j}$ in equation (4) is expressed as a polynomial of (n−1)-th order or less indicated by $h^{(i,j)}(x)$, the first row vector of $F_{s,t}$ in equation (4) as a polynomial of (n−1)-th order or less indicated by $f^{(u,v)}(x)$, and the first row vector of $G_i$ in equation (4) as a polynomial of (n−1)-th order or less indicated by $g^{(i)}(x)$.

As described above, polynomial multiplying circuits 21 in polynomial multiplying unit 11 and polynomial multiplying circuits 42 in polynomial dividing and multiplying unit 12 are constructed as shown in FIG. 4. In these polynomial multiplying circuits, the bit sequence $h_0, h_1, \ldots, h_{n-1}$ of n bits for determining whether the connecting elements 33 are in the connected state or the unconnected state is determined by the selection of the polynomials $h^{(i,j)}(x)$, $f^{(u,v)}(x)$ described above. The selection of the bit sequence $g_0, g_1, \ldots, g_{n-ki}$ of the $(n-k_i+1)$ bits for determining connections of polynomial dividing circuit 41 in polynomial dividing and multiplying unit 12 is determined by the selection of the polynomial $g^{(i)}(x)$. An example of selection of the polynomials $h^{(i,j)}(x)$, $f^{(u,v)}(x)$, $g^{(i)}(x)$ will be described below.

It is assumed that an integer q is a power of 2, i.e., $q = 2^s$ where s is a positive integer, and the integer n is $n = q - 1$. Then, $g^{(i)}(x)$ is determined according to equation (7) with respect to a primitive element α of a finite field GF(q) having q pieces of elements and an integer i which satisfies $1 \leq i \leq r$.

$$g^{(i)}(x) = \prod_{k \in B_i} (x - \alpha^k) \quad (7)$$

where $B_i$ represents a subset of integers ranging from 0 to q−2. When the polynomial according to equation (7) is developed, the coefficients of $B_i$ are either 0 or 1. Therefore, $g^{(i)}(x)$ is a polynomial produced by multiplying minimum polynomials on a prime field (GF(2)) of elements of GF(q) determined by $B_i$. Subsets $B_1, B_2, \ldots, B_r$ shall satisfy the following relationship (equation (8)):

$$B_1 \subseteq B_2 \subseteq \ldots \subseteq B_r \quad (8)$$

This means that when i and j are integers satisfying the ranges $1 \leq i \leq r$, $1 \leq j \leq r$, $g^{(i)}(x)$ is divisible by $g^{(j)}(x)$ if $i < j$.

The polynomial $h^{(i,j)}(x)$ is established as a multiple polynomial of $g^{(i)}(x)$ with a modulus of $x^n-1$. In other words, the polynomial $h^{(i,j)}(x)$ of (n−1)-th order or less is established as satisfying the condition of equation (9).

$$h^{(i,j)}(x) \equiv \Psi^{(i,j)}(x)g^{(i)}(x) \bmod (x^n-1) \qquad (9)$$

where i is an integer in the range of $1 \leq i \leq r$, j is an integer in the range of $1 \leq j \leq m-r$, and $\Psi^{(i,j)}(x)$ is a polynomial of (n−1)-th order or less in which the coefficients of the terms are 0 or 1. As with the polynomial $h^{(i,j)}(x)$, the polynomial $f^{(u,v)}(x)$ described above is established as a multiple polynomial of $g^{(i)}(x)$ with a modulus of $x^n-1$. In other words, the polynomial $f^{(u,v)}(x)$ of (n−1)-th order or less is established as satisfying the condition of equation (10).

$$f^{(u,v)}(x) \equiv \phi^{(u,v)}(x)g^{(u)}(x) \bmod (x^n-1) \qquad (10)$$

where v is an integer in the range of $2 \leq v \leq r$, u is an integer in the range of $1 \leq u \leq v-1$, and $\phi^{(u,v)}(x)$ is a polynomial of (n−1)-th order or less in which the coefficients of the terms are 0 or 1.

Connections of polynomial multiplying circuits 21 in polynomial multiplying unit 11 will be described below. With reference to FIG. 4 which shows the polynomial multiplying circuit, connecting elements 33 are set to the connected state or the unconnected state depending on the predetermined bit sequence $h_0, h_1, \ldots, h_{n-1}$, of n bits. Specifically, if j is an integer in the range of $0 \leq j \leq n-1$, then when $h_j$ is 1, the connecting element marked "$h_j$" is in the connected state, and when $h_j$ is 0, the connecting element marked "$h_j$" is in the unconnected state. The bit sequence of n bits for determining such connections is selected as follows:

Since the coding device according to the present exemplary embodiment includes r pieces of polynomial multiplying units 11 as shown in FIG. 2, r pieces of polynomial multiplying units 11 are numbered 1, 2, ..., r from above in the figure. Furthermore, since each polynomial multiplying unit 11 includes at most (m−r) pieces of polynomial multiplying circuits 21 as shown in FIG. 3, these polynomial multiplying circuits are numbered 1, 2, ..., m−r from the left. If it is assumed that i is an integer in the range of $1 \leq i \leq r$, j is an integer in the range of $1 \leq j \leq m-r$, and k is an integer in the range of $0 \leq k \leq n-1$, then when the bit sequence of n bits indicative of the connections of the j-th polynomial multiplying circuit in the i-th polynomial multiplying unit is expressed by $h_0^{(i,j)} h_1^{(i,j)}, \ldots, h_{n-1}^{(i,j)}, h_k^{(i,j)}$ is used as the coefficient of a term $x^k$ in $\Psi^{(i,j)}(x)$ in equation (9). With this setting, it is possible to set the coefficients of all polynomial multiplying circuits in polynomial multiplying units 11 of the coding device shown in FIG. 2, using the polynomial $\Psi^{(i,j)}(x)$ according to equation (9).

The states of the connecting elements in polynomial dividing circuit 41 and polynomial multiplying circuits 42 of polynomial dividing and multiplying units 12 will be described below.

Figure 6:
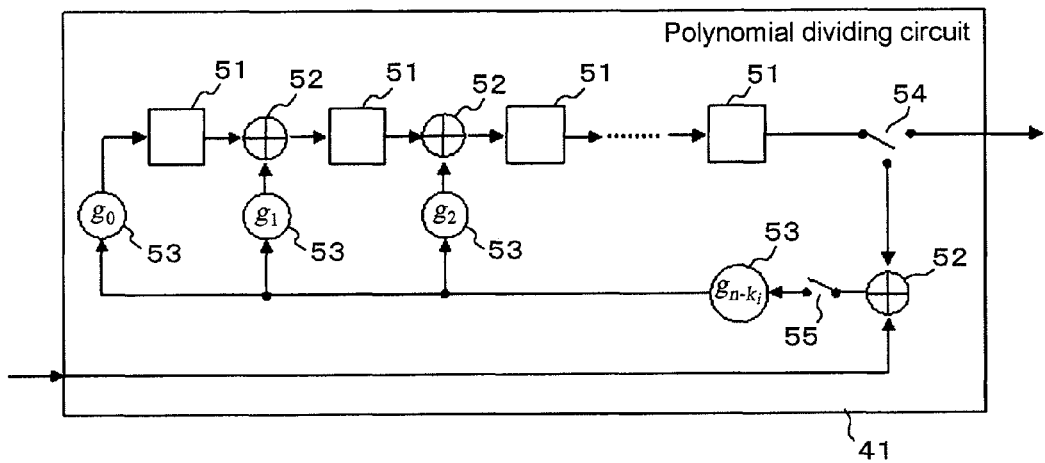
FIG. 6 is a block diagram showing an example of the arrangement of a polynomial dividing circuit.

FIG. 6 shows the arrangement of polynomial dividing circuit 41. In FIG. 6, as described above, whether connecting elements 53 are in the connected state or the unconnected state is determined by the predetermined bit sequence $g_0, g_1, \ldots, g_{n-ki}$ of (n−$k_i$+1) bits. If it is assumed that i is an integer in the range of $1 \leq i \leq n$ and j is an integer in the range of $1 \leq j \leq n-k_i$, then when $g_j$ is 1, the connecting element in the portion marked "$g_j$" is in the connected state, and when $g_j$ is 0, the connecting element in the portion marked "$g_j$" is in the unconnected state. When the bit sequence of (n−$k_i$+1) bits indicative of the states of the connecting elements in the polynomial dividing circuit in the polynomial dividing and multiplying unit [i] is expressed by $g_0^{(i)}, g_1^{(i)}, \ldots, g_{n-k1}^{(i)}, g_j^{(i)}$ is used as the coefficient of a term $x^j$ in a polynomial $\sigma^{(i)}(x)$ which is determined from the polynomial $g^{(i)}(x)$ of equation (8) based on equation (11):

$$\sigma^{(i)}(x) = \frac{(x^n - 1)}{g^{(i)}(x)} \qquad (11)$$

With this setting, it is possible to set the coefficients of polynomial dividing circuit 41 appearing in polynomial multiplying units 12 of the coding device shown in FIG. 2, using the polynomial $g^{(i)}(x)$ according to equation (8).

As shown in FIG. 6, the output of polynomial dividing circuit 41 corresponds to the remainder that is obtained when the polynomial whose coefficients are represented by the input bit sequence to polynomial dividing circuit 41 is divided by the polynomial $\sigma^{(i)}(x)$ according to equation (11). Therefore, if $g^{(i)}(x)=1$, i.e., if $\sigma^{(i)}(x)=x^n-1$, then polynomial dividing circuit 41 outputs the input bit sequence as it is.

If it is assumed that v is an integer in the range of $1 \leq v \leq r$ and u is an integer in the range of $1 \leq u \leq v-1$, then each of the connecting elements in u-th polynomial multiplying circuit 42 from above (see FIG. 5) in v-th polynomial dividing and multiplying unit 12 is set to either the connected state or the unconnected state depending on the coefficient of each of the terms of $\phi^{(u,v)}(x)$ of equation (10) in the same manner as with polynomial multiplying circuits 21 in polynomial multiplying units 11.

The order of the polynomial $\sigma^{(i)}(x)$ according to equation (11) for determining the state of connecting element 53 in polynomial dividing circuit 41 agrees with (n−$k_i$), and the rank R of the matrix H according to equation (4) is given by following equation (12) according to equations (7) to (11):

$$R = \sum_{i=1}^{r} (n - k_i) \qquad (12)$$

Therefore, the number of redundant bits in the coding scheme where the matrix H according to equation (4) serves as a check matrix is indicated by R shown in equation (12), and the number of information bits is in agreement with K shown in equation (3). The bit length of one block equal to the sum of the number of information bits and the number of redundant bits is n·m.

Figure 7:
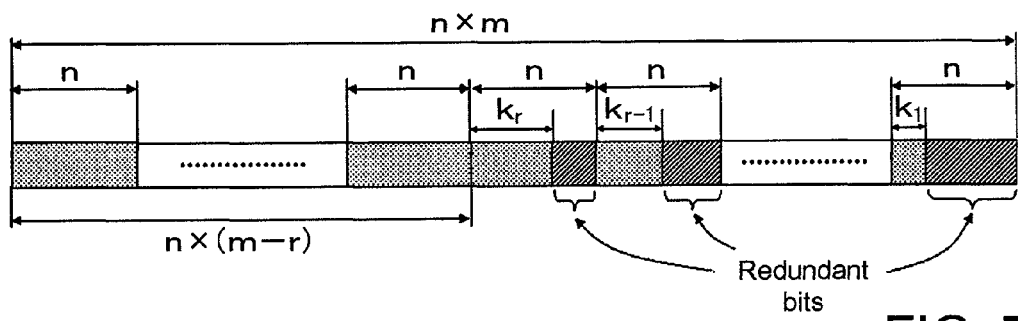
FIG. 7 is a diagram showing an example of a frame format for a code bit sequence.

FIG. 7 shows an example of a frame format for a code bit sequence having a length of n·m bits which is coded by the error correction coding device according to the present exemplary embodiment. The K bits in the code bit sequence according to the equation (3) is in full agreement with the information bit sequence supplied to the coding device. Therefore, the coding scheme according to the present exemplary embodiment is a systematic coding scheme.

Operation of the error correction coding device according to the present exemplary embodiment will be described below.

Figure 1:
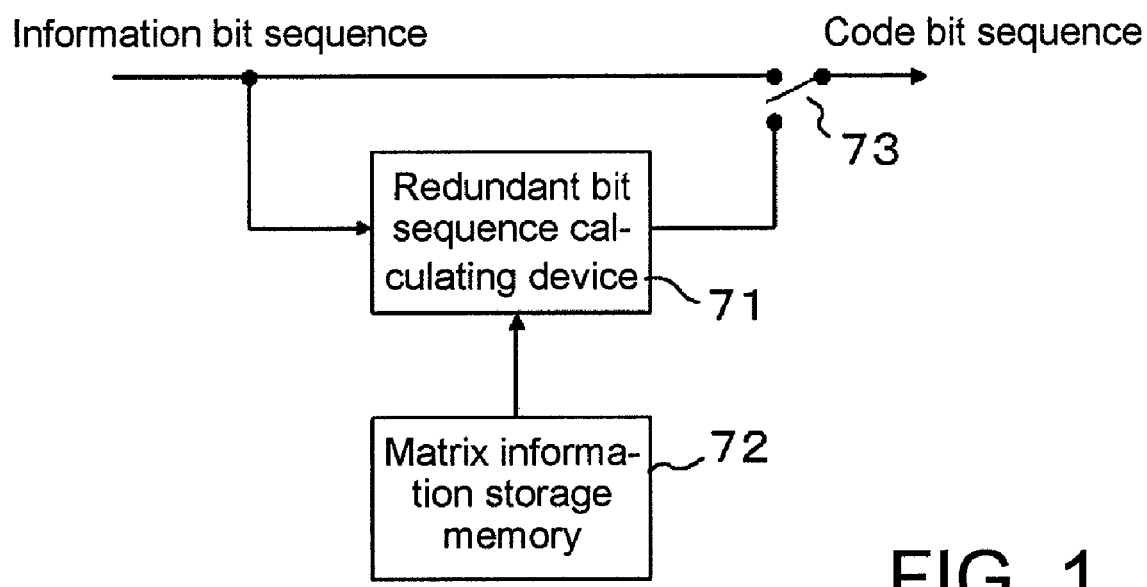
FIG. 1 is a block diagram showing an example of the arrangement of an error correction coding device according to the related art.

The error correction coding device shown in FIG. 1 is sequentially supplied with the information bit sequence having the length of K bits according to the equation (3), which has been divided into blocks for error correction coding. Switch 13 is shifted to sequentially supply n(m−r) bits ranging from the first bit to the n(m−r)-th bit, among the information bits having the length K, to all r pieces of polynomial multiplying units 11 which are arranged in parallel with each other. At this time, switch 14 is set to a position for outputting the input n(m−r) bits directly as an output of the coding device. When the n(m−r)-th bit has been entered to the encoding device, switch 13 is shifted to enter subsequent $k_r$ bits to polynomial dividing and multiplying unit [r] at the first stage.

Polynomial dividing and multiplying unit [r] is supplied with the information bits of $k_r$ bits described above and a total of n·r bits of the outputs from r pieces of polynomial multiplying units 11, and outputs n(r−1) bits to be supplied to polynomial dividing and multiplying unit [r−1] at the next stage and n bits as an output of the coding device. Switch 14 is then connected to the output terminal of polynomial dividing and multiplying unit [r], and outputs the n bits. If it is assumed that i is an integer in the range of $2 \leq i \leq r-1$, then switch 13 is similarly shifted to supply an information bit sequence of $k_i$ bits to polynomial dividing and multiplying unit [i]. Polynomial dividing and multiplying unit [i] processes the $k_i$ bits of the information bits and n·i bits supplied from polynomial dividing and multiplying unit [i+1], and generates n bits as an output of the coding device and n(i−1) bits to be supplied to polynomial dividing and multiplying unit [i−1] at the next stage. If the information bit sequence of K bits is continuously supplied to error correction coding device according to the present exemplary embodiment, then since each polynomial dividing and multiplying unit 12 requires an n unit time for its processing operation, it is necessary to delay the inputting of an information bit sequence ($k_{i-1}$ bits) to polynomial dividing and multiplying unit [i−1] to be operated next, during the period of time after the $k_i$ bits of the information bit sequence are entered until the processing operation of polynomial dividing and multiplying unit [i] is finished and completes its output.

Finally, switch 13 is shifted to enter an information bit sequence of $k_1$ bits and the output of n bits from polynomial dividing and multiplying unit [2] to polynomial dividing and multiplying unit [1]. As a result, polynomial dividing and multiplying unit [1] outputs n bits. This output of n bits is delivered from the coding device through switch 14. With respect to the connections of the polynomial dividing circuits which have been illustrated by way example above, when $g^{(i)}(x)=1$, then $k_i=0$ bit, and the polynomial division in polynomial dividing and multiplying unit [i] is omitted as described above.

Details of operation of polynomial multiplying units 11 will be described below. As described above, each of polynomial multiplying units 11 is sequentially supplied with n(m−r) bits ranging from the first bit to the n(m−r)-th bit of the information bit sequence. These n(m−r) bits are divided into sets of n bits, which are distributed, as shown in FIG. 3, to (m−r) pieces of polynomial multiplying circuits 21 in polynomial multiplying unit 11. The first bit to the n-th bits are sequentially supplied to the first polynomial multiplying circuit, i.e., the polynomial multiplying circuit on the left end in FIG. 3. When the n-th bit has been entered, switch 23 is shifted to supply the (n+1)-th bit to the 2n-th bit through exclusive-OR circuit 22 to the second polynomial multiplying circuit, i.e., the second polynomial multiplying circuit from the left end in FIG. 3. In other words, each of the (n+1)-th bit to the 2n-th bit and each of the output bits from the first polynomial multiplying circuit are exclusive-ORed into outputs that is sequentially supplied to second polynomial multiplying circuit. Similarly, if it is assumed that j is an integer in the range of $2 \leq j \leq m-r-1$, the an (jn+1)-th bit to the (j+1)n-th bit are supplied through exclusive-OR circuit 22 to the (j+1)-th polynomial multiplying circuit, and thus each of the (jn+1)-th bit to the (j+1)n-th bit and each of the output bits from the j-th polynomial multiplying circuit are exclusive-ORed into outputs that is sequentially supplied to the (j+1)-th polynomial multiplying circuit. The output of n bits from the polynomial multiplying circuit at the final stage, i.e., from the (m−r)-th polynomial multiplying circuit, is the output from polynomial multiplying unit 11 shown in FIG. 3.

Operation of the polynomial multiplying circuit will be described below with reference to FIG. 4. The data in flip-flops 31 used as registers are initialized to zero, and the n bits of a bit sequence are sequentially entered, one bit at a time, to the polynomial multiplying circuit. During this time, switch 34 is set to the feedback loop side, i.e., the side which is not the output side. When all the n bits have been entered, switch 34 is shifted to successively output the data stored in flip-flops 31.

Operation of polynomial dividing and multiplying units 12 will be described below with reference to FIG. 5. As described above, each of polynomial dividing and multiplying units 12 comprises at most one polynomial dividing circuit 41 and at most (r−1) pieces of polynomial multiplying circuits 42. Each of polynomial dividing and multiplying units 12 is distinguished by the number of polynomial multiplying circuits 42 included therein. However, polynomial dividing and multiplying units 12 are identical in basic operation to each other. When the processing operation of polynomial multiplying units 11 described above is finished, the coding device according to the present exemplary embodiment has already been supplied with the n(m−r) bits among the K bits of the information bit sequence according to equation (3).

Polynomial dividing and multiplying unit [r] is sequentially supplied with the (n(m−r)+1)-th bit to the (n(m−r)+$k_r$)-th bit of the information bit sequence through terminal 45. At the same time, polynomial dividing and multiplying unit [r] is also sequentially supplied with the bit sequences of n bits from respective r pieces of polynomial multiplying units 11 through terminals 46. While the information bit sequence of $k_r$ bits is being supplied through terminal 45, the information bit sequence from terminal 45 and the bit sequence input from r-th terminal 46, i.e., the terminal at the lower end, are exclusive-ORed into an output that is supplied to polynomial dividing circuit 41. At this time, selector 44 is set to a position for selecting the input from terminal 45. The input from terminal 45 is delivered directly from output terminal 47. The output from selector 44 is delivered from output terminal 47, and also supplied to (r−1) pieces of exclusive-OR circuits 43. The inputs from first to (r−1)-th terminals 46, other than the input from terminal 46 to polynomial dividing circuit 41, are supplied through exclusive-OR circuits 43, which are also supplied with the output from the selector, to (r−1) pieces of polynomial multiplying circuits 42.

When the ((n(m−r)+$k_r$)-th bit has been entered through terminal 45, selector 44 is set such that it selects an output produced by exclusive-ORing the output from polynomial dividing circuit 41 and the data entered from r-th terminal 46. At this time, polynomial dividing circuit 41 outputs (n−$k_r$) bits. The output from selector 44 is delivered through output terminal 47 as an output from the coding device, i.e., as a redundant bit sequence, is also subjected to exclusive-OR operation with the inputs from (r−1) pieces of terminals 46. The results of the exclusive-OR operation are supplied to polynomial multiplying circuits 42.

Of the n bits delivered from terminal 47, former $k_r$ bits directly represent the information bit sequence entered from terminal 45, and latter (n−$k_r$) bits serve as redundant bits. Processing of $k_r$ bits ranging from the (n(m−r)+1)-th bit to the (n(m−r)+$k_r$)-th bit of the information bit sequence and the former $k_r$ bits of the bit sequence entered from terminals 46 requires a $k_r$ unit time. Thereafter, processing of output (n−$k_r$)

bits from the polynomial dividing circuit and latter (n−$k_r$) bits of the bit sequence entered from terminals 46 requires a (n−$k_r$) unit time. Accordingly, polynomial dividing and multiplying unit [r] requires an n unit time for its processing operation. The data stored in flip-flops (i.e., registers) 31 in (r−1) pieces of polynomial multiplying circuits 42 are delivered from terminal 48 and supplied to polynomial dividing and multiplying unit [r−1] at the next stage.

Similarly, if it is assumed that i is an integer in the range of 2≦i≦r−1, then polynomial dividing and multiplying unit [i] generates an output of the coding device from the $k_i$ bits entered from terminal 45 and the n·i bits entered from polynomial dividing and multiplying unit [i+1] at the previous stage through terminals 46, and delivers the generated output through terminal 47, and also generates data as an input to polynomial dividing and multiplying unit [i−1] at the next stage. The generated data are delivered from terminals 48 of polynomial dividing and multiplying unit [i] during the operation of polynomial dividing and multiplying unit [i−1] at the next stage. Of the n bits delivered from terminal 47, former $k_i$ bits directly represent the information bit sequence entered from terminal 45, and latter (n−$k_i$) bits serve as redundant bits.

Finally, $k_0$ bits ranging from the (K−$k_0$+1)-th bit to the K-th bit among the information bits are entered to polynomial dividing and multiplying unit [1]. Polynomial dividing and multiplying unit [1] comprises at most one polynomial dividing unit 41, which is supplied with an input produced by exclusive-ORing former $k_0$ bits of the n bits that is input from polynomial dividing and multiplying unit [2] through terminals 46 and the $k_0$ bits entered through terminal 45. Of the n bits delivered through terminal 47, former $k_0$ bits directly represent the bit sequence entered through terminal 45, and latter (n−$k_0$) bits are produced by exclusive-ORing the output of (n−$k_0$) bits from polynomial dividing circuit 41 and the latter (n−$k_0$) bits of the n bits entered through terminals 46.

Operation of polynomial dividing circuit 41 will be described below with reference to FIG. 6. For the sake of brevity, the polynomial dividing circuit in polynomial dividing and multiplying unit [r] will be described below. However, the polynomial dividing circuits in the other polynomial dividing and multiplying units are also identical with respect to basic operation.

In polynomial dividing circuit 41, the data in (n−$k_r$) pieces of flip-flops (i.e., registers) 51 are initialized to zero, switch 54 is set to the feedback loop side, i.e., the side which is not the output side, and switch is closed. When the $k_r$ bits of the bit sequence are sequentially supplied to polynomial dividing circuit 41, the data in the shift register made up of flip-flops 51 are successively updated. When the $k_r$ bits have been entered, switch 55 is opened and the switch 54 is shifted to the output side, successively outputting the data from flip-flops 51.

As described above, when the error correction coding device according to the present exemplary embodiment is given an information bit sequence having a length of K bit, divided into blocks, where K is a positive integer, the error correction coding device further divides the information bit sequence into (m−r) pieces of blocks each having a length n and r pieces of blocks have respective lengths $k_1, k_2, k_3, \ldots, k_r$. The error correction coding device delivers a code bit sequence having a length m·n according to the frame format shown in FIG. 7, using the check matrix according to equation (4) which corresponds to a low-density parity-check code. Here, m, n represent integers of 2 or greater, r an integer in the range of 1≦r≦m, and $k_1, k_2, k_3, \ldots, k_r$ respective integers in the range of 0≦$k_1, k_2, k_3, \ldots, k_r$≦n.

A maximum of r(m−r) pieces of polynomial multiplying circuits 21 are included in total in the r pieces of polynomial multiplying units 11. The maximum of r(m−r) pieces of polynomial multiplying circuits 21 are supplied with (m−r) pieces of blocks each having a length n, of the bit sequences produced by dividing the input information bit sequence having the length of K bits in the manner described above, and deliver respective sequences each having a length n. The r pieces of polynomial dividing and multiplying units 12 include a maximum of r pieces of polynomial dividing circuits 41 in total and a maximum of r(r−1) pieces of polynomial multiplying circuits 42 in total. Using these polynomial dividing circuits 41 and polynomial multiplying circuits 42, r pieces of polynomial dividing and multiplying units 12 are supplied with blocks having lengths $k_1, k_2, k_3, \ldots, k_r$ produced by dividing the input information bit sequence having the length of K bits as described above, and also with the output data of polynomial multiplying units 11, and deliver redundant bit sequences having respective lengths n−$k_1$, n−$k_2$, n−$k_3$, . . . , n−$k_r$.

For determining whether connecting elements 53 (see FIG. 6) in each of a maximum of r pieces of polynomial dividing circuits 41 are in the connected state or the unconnected state, the coding apparatus according to the present exemplary embodiment employs a series of polynomials associated with minimum polynomials on a prime field of elements of a finite field as a maximum of r pieces of polynomials. The coding apparatus according to the present exemplary embodiment also selects polynomials for determining the state of the connecting elements in polynomial multiplying circuits 42 in polynomial dividing and multiplying units 12, such that a matrix configured by a product polynomial with a polynomial corresponding to polynomial dividing circuit 41 will be a sparse matrix. With the polynomials being thus employed and selected, the coding gain is increased for efficient processing operation.

A more specific method of setting polynomials $g^{(1)}(x)$, $g^{(2)}(x), \ldots, g^{(r)}(x$ which satisfies equations (7) and (8) will be described below as a further specific example of the present invention.

It is assumed that an integer q is a power of 2, i.e., q=$2^s$ where s is a positive integer, and the integer n described above is n=q−1. Polynomial $g_L(x)$ is determined according to equation (13) with respect to a primitive element a of a finite field GF(q) comprising q pieces of elements and an integer L which satisfies 0≦L≦s−1.

$$g_L(x) = \prod_{\substack{k=1 \\ W(k) \leq L}}^{q-2} (x - \alpha^k) \quad (13)$$

where W(k) represents a sum total, as an integer, of coefficients when an integer k in the range of 1≦k≦q−2 is processed by binary expansion. $g_0(x)$=1. When the polynomial according to equation (13) is developed, its coefficients are either 0 or 1. Using the polynomial $g_L(x)$ of equation (13), $g^{(i)}(x)$ is selected according to equation (14).

$$g^{(i)}(X) = g_L(X), \quad 2^L \leq i \leq 2^{L+1} \quad (14)$$

It is assumed that $g^{(1)}(x)=g^{(2)}(x)$=1. If it is assumed that i and j are integers in the ranges of 1≦i≦r, 1≦j≦r, then since $g^{(i)}(x)$ is divisible by $g^{(j)}(x)$ if i<j, the polynomial $g^{(1)}(x)$, $g^{(2)}(x), \ldots, g^{(r)}(x)$ established according to equations (13), (14) satisfies the requirements of equations (7), (8).

If it is assumed that i is an integer in the range of $1 \leq i \leq r$ and j is an integer in the range of $1 \leq j \leq m-r$, polynomial $h^{(i,j)}(x)$ is selected as a multiple polynomial of $g^{(i)}(x)$, as shown in equation (9). If it is assumed that v is an integer in the range of $2 \leq v \leq r$ and u is an integer in the range of $1 \leq u \leq v-1$, the polynomial $f^{(u,v)}(x)$ is selected as a multiple polynomial of $g^{(u)}(x)$, as shown in equation (10), as with the polynomial $h^{(i,j)}(x)$. Although the polynomials $h^{(i,j)}(x)$, $f^{(u,v)}(x)$ can be flexibly selected, they can be selected such that the check matrix H according to equation (4) which is determined by the polynomial $g^{(i)}(x)$ according to the equation (14) and the polynomials $h^{(i,j)}(x)$, $f^{(u,v)}(x)$ is in agreement with a matrix produced by transforming fundamental rows of a block matrix H' whose blocks are represented by sparse cyclic matrixes. As a result, a bit sequence that is coded by the coding scheme according to the present exemplary embodiment is a low-density parity-check code, and can be decoded by a repetitive decoding scheme such as a sum-product decoding process, for example.

Specific numerical examples will be described below. The integers s, q referred to above are set to s=3, q=8, and $\alpha$ represents a primitive element of a finite field GF(8) having a primitive polynomial $x^3+x+1$. In this case n=7, and it is assumed that m=9 and r=3. From the equations (13), (14), $g^{(1)}(x)=g^{(2)}(x)=1$, $g^{(3)}(x)$ agrees with the primitive polynomial, so that $g^{(3)}(x)=x^3+x+1$. According to equation (9), $\Psi^{(i,j)}(x)$ for determining $h^{(i,j)}(x)$ where i is an integer in the range of $1 \leq i \leq 3$ and j is an integer in the range of $1 \leq j \leq 6$ is selected as follows:

$$\Psi^{(1,1)}(x)=0, \Psi^{(1,2)}(x)=1, \Psi^{(1,3)}(x)=x^4, \Psi^{(1,4)}(x)=x^5,$$
$$\Psi^{(1,5)}(x)=x^5, \Psi^{(1,6)}(x)=x, \Psi^{(2,1)}(x)=1,$$
$$\Psi^{(2,2)}(x)=x^4, \Psi^{(2,3)}(x)=x^5, \Psi^{(2,4)}(x)=x^5,$$
$$\Psi^{(2,5)}(x))=x, \Omega^{(2,6)}(x)=1, \Psi^{(3,1)}(x)=0,$$
$$\Psi^{(3,2)}(x)=x^6, \Psi^{(3,3)}(x)=x^3, \Psi^{(3,4)}(x)=x^2, \Psi^{(3,5)}(x)$$
$$x^5, \Psi^{(3,6)}(x)=x^5 \quad (15)$$

According to equation (10), $\phi^{(u,v)}(x)$ for determining $f^{(u,v)}(x)$ is selected as $\phi^{(1,3)}(x)=1$, $\phi^{(2,3)}(x)=x^5$, and $\phi^{(1,2)}(x)=x^5$. All the states of the respective connecting elements in the coding device according to the present exemplary embodiment are thus determined. The check matrix H according to equation (4) is also determined, which is in agreement with a matrix produced by transforming fundamental rows of a matrix H' according to following equation (16):

$$H' = \begin{pmatrix} 0 & I_4 & I_1 & I_2 & I_2 & I_5 & I_4 & I_2 & I_4 \\ I_4 & I_1 & I_2 & I_2 & I_5 & I_4 & I_2 & I_4 & 0 \\ I_1 & I_2 & I_2 & I_5 & I_4 & I_2 & I_4 & 0 & I_3 \end{pmatrix} \quad (16)$$

where "0" in bold represents a 7×7 all-zero matrix. If it is assumed that k is an integer in the range of $0 \leq k \leq 6$, $I_k$ represents a cyclic permutation matrix where only $a_k$ is 1 and all other elements are 0. By applying a repetitive decoding process such as a sum-product decoding process which corresponds to the check matrix H', a bit sequence which is error-correction-coded by the coding device according to the present exemplary embodiment can be decoded efficiently and highly accurately.

Finally, advantages obtained by installing the coding device according to the present exemplary embodiment and a device for carrying out a repetitive decoding process such as a sum-product decoding process which is designed based on the coding device, respectively at a transmission side and a reception side, will be described below by way of a numerical example. The integers s, q referred to above are set to s=6, q=64, and $\alpha$ represents a primitive element of a finite field GF(64) having a primitive polynomial $x^6+x+1$. In this case n=63, and It is assumed that m=65 and r=8. From equations (13), (14), $g^{(1)}(x)=g^{(2)}(x)=1$, $g^{(3)}(x)$ and $g^{(4)}(x)$ agree with the primitive polynomial, so that $g^{(3)}(x)=g^{(4)}(x)=x^6+x+1$. According to the equations (13), (14), $g^{(5)}(x)$, $g^{(6)}(x)$, $g^{(7)}(x)$, $g^{(8)}(x)$ are in agreement with a polynomial $g_2(x)$ shown in equation (17).

$$g_2(x)=(x^6+x+1)(x^6+x^4+x^2+x+1)(x^6+x^5+x^2+x+1)(x^3+x^2+1) \quad (17)$$

As with the above specific example, the polynomial $\Psi^{(i,j)}(x)$, $\phi^{(u,v)}(x)$ can be selected such that the check matrix according to equation (4) is in agreement with a matrix produced by transforming fundamental rows of a block matrix H' whose components include zero matrixes and cyclic permutation matrixes. At this time, since n=63 and m=65, the code length is 4095 bits, and since $k_1=k_2=0$, $k_3=k_4=6$, $k_5=k_6=k_7=k_8=21$, the number of information bits is 3687 according to equation (3). Through the above selection, it is possible to construct a coding apparatus having a code length of 4095 bits and an information bit length of 3687 bits, for decoding a bit sequence highly accurately and efficiently based on a repetitive decoding process such as a sum-product decoding process.

For performing communications using a signal modulated by binary phase shift keying (BPSK) modulation scheme in an additive white Gaussian noise environment, it is possible to achieve a coding gain of 3.5 dB or higher when the bit error probability is 0.1% after decoding, by applying the code described above which has a code length of 4095 bits and 3687 information bits. At this time, a band increasing ratio is about 11%.

In the present specific example, as described above, the parameter r corresponding to the number of row blocks of the matrix according to equation (4) is set to 8. The coding ratio and the band increasing ratio can be changed without the need for large modifications of the coding device, by changing the parameter r. For example, only the parameter r may be re-set from 8 to 4 with other settings such as the selection of polynomials remaining unchanged. At this time, the block matrix H has 4 row blocks and 65 column blocks, and each row block is in agreement with the first to fourth row blocks of the block matrix H at the time r=8. Similarly, each row block of the sparse block matrix H' produced by transforming fundamental rows of the block matrix H is in agreement with the first to fourth row blocks of the sparse block matrix of the case of r=8. A coding device for r=4 can be realized by separating portions of the polynomial multiplying circuits and the polynomial dividing circuits in the coding device for r=8. A circuit provided by separating the lower four of the eight parallel polynomial multiplying units and further separating the polynomial dividing circuits and the polynomial multiplying circuits connected to the lower four polynomial multiplying units with respect to polynomial dividing and multiplying units [i] where i=8, 7, 6, 5, in FIG. 2, is in agreement with the arrangement of coding device for r=4. In this case, the code length is 4095 bits and the information bit length is 3885 bits, with the band increasing ratio of about 6.2%. In the above communication environment, it is possible to achieve a coding gain of 2.5 dB or higher when the bit error probability after decoding is 0.1%.

An error correction coding device according to another exemplary embodiment of the present invention will be described below.

In the above exemplary embodiment, polynomial multiplying unit 11 shown in FIG. 3 comprises (m−r) pieces of polynomial multiplying circuits 21 connected in series with each other by exclusive-OR circuits 22 where m is a positive integer and r is an integer in the range of $1 \leq r \leq m$. The (m−r) pieces of polynomial multiplying circuits that are connected in series with each other can be arranged in a parallel configuration by performing serial-to-parallel conversion on the input data to the polynomial multiplying unit. The outputs from the (m−r) pieces of polynomial multiplying circuits that are arranged in the parallel configuration are exclusive-ORed into an output from the polynomial multiplying unit. The parallel configuration is advantageous in that the number of flip-flops in the polynomial multiplying units is reduced as the flip-flops are shared by the polynomial multiplying units arranged in the parallel configuration.

Figure 8:
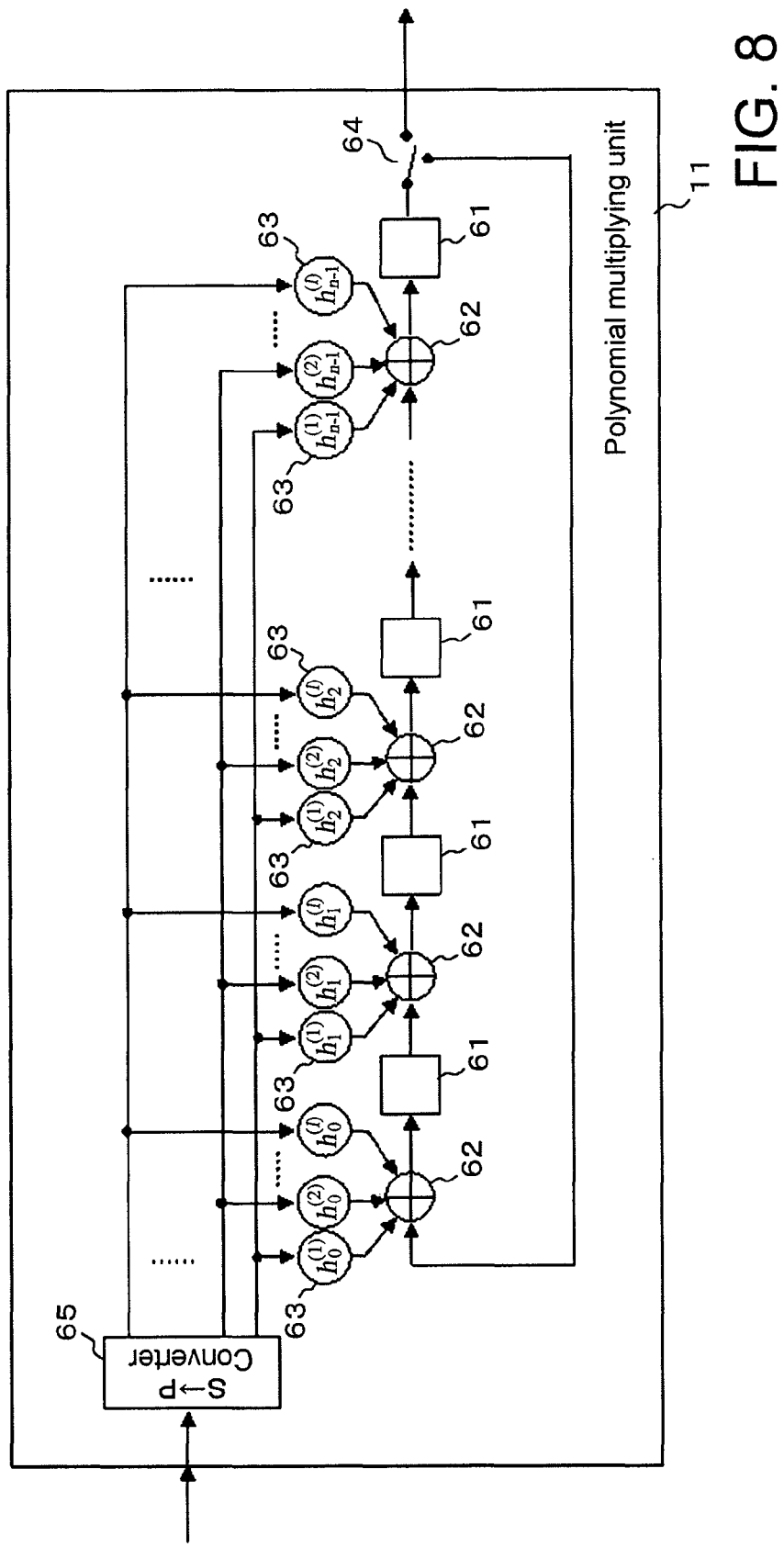
FIG. 8 is a block diagram showing another example of the arrangement of the polynomial multiplying unit.

FIG. 8 shows such a polynomial multiplying unit which includes (m−r) pieces of polynomial multiplying circuits arranged in a parallel configuration. For the sake of brevity, it is assumed that (m−r) is represented by N. The polynomial multiplying unit comprises: n pieces of flip-flops 61 used as registers where n is a positive integer; at most n pieces of (N+1)-input exclusive-OR circuits 62; connecting elements 63 grouped into sets of N connecting elements associated with respective exclusive-OR circuits 62 and having a connected state or an unconnected state determined depending on a check matrix; switch 64; and serial-to-parallel (S→P) converter 65 for converting a serial input bit sequence into N (=m−r) parallel bits. Exclusive-OR circuits 62 are arranged for the respective flip-flops 61 and connected to the inputs of the flip-flops. The n pieces of flip-flops 61 that are associated with respective exclusive-OR circuits 62 are connected in series with each other through exclusive-OR circuits 62. Switch 34 is connected to the output of flip-flop 61 at a final stage. Switch 34 serves to selectively supply an output from flip-flop 61 at the final stage as an output of the polynomial multiplying unit to the outside, or return the output from flip-flop 61 at the final stage to first flip-flop 61, i.e., flip-flop 61 on the left end in FIG. 8, through exclusive-OR circuit 62 at the first stage.

Connecting elements 63, grouped into sets of N pieces of connecting elements associated the respective exclusive-OR circuits 62, serve to determine whether N pieces of outputs from serial-to-parallel converter 65 are to be supplied to corresponding exclusive-OR circuit 62 or not. If it is assumed that i is an integer in the range of $1 \leq i \leq n$, it is determined whether N pieces of outputs from serial-to-parallel converter 65 are to be supplied to i-th exclusive-OR circuit 62 from the right or not, depending on whether the corresponding bit of the bit sequence $h_{i+1}^{(1)}, h_{i+1}^{(2)}, \ldots, h_{i+1}^{(N)}$ is "1" or "0."

The output from the polynomial multiplying unit shown in FIG. 8 is in agreement with an output produced by exclusive-ORing the outputs from N (=m−r) pieces of polynomial multiplying circuits. Whereas the polynomial multiplying unit shown in FIG. 3 employs n(m−r) pieces of flip-flops, the polynomial multiplying unit shown in FIG. 8 employs n pieces of flip-flops. Therefore, the parallel configuration is effective to reduce the number of flip-flops as shown in FIG. 8.

In the circuit shown in FIG. 8, the number of fan-ins to exclusive-OR circuits 62 disposed between the flip-flops is greater than the number of fan-ins to exclusive-OR circuits 32 in the polynomial multiplying circuit shown in FIG. 4. If the maximum number of fan-ins of exclusive-OR circuits in the circuit shown in FIG. 8 is in excess of an allowable range, then the number of fan-ins can be held in the allowable range by arranging polynomial multiplying circuits in parallel and series connections. The polynomial multiplying unit thus arranged is equivalent to the polynomial multiplying unit shown in FIG. 3 where the circuit shown in FIG. 8 is added in place of each of polynomial multiplying circuits 21.

Figure 9:
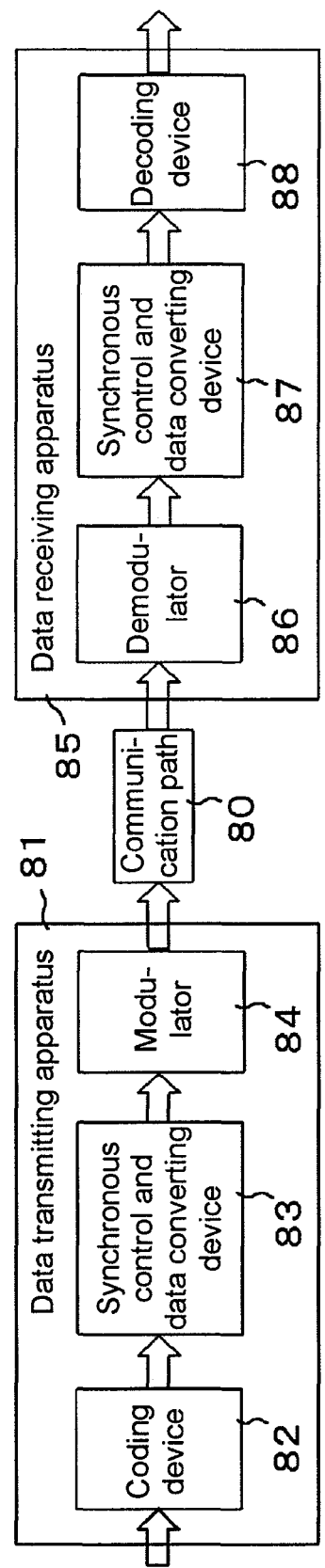
FIG. 9 is a block diagram showing an example of the arrangement of a data communication system which employs a coding device according to the present invention.

An application of the error correction coding devices according to the above exemplary embodiments will be described below. FIG. 9 shows an example of the arrangement of a data communication system which employs a coding device according to the present invention. The data communication system comprises data transmitting apparatus 81 and data receiving apparatus 85 for receiving data transmitted from data transmitting apparatus 81 through communication path 80. Data transmitting apparatus 81 comprises coding device 82 according to the present invention which is supplied with data to be transmitted, synchronous control and data converting device 83 for performing frame synchronization on a bit sequence delivered from coding device 82, and modulator 84 for modulating data delivered from synchronous control and data converting device 83 and sending the modulated data to communication path 80. Data receiving apparatus 82 comprises demodulator 86 for demodulating information received from communication route 50, synchronous control and data converting device 87 for converting data delivered from demodulator 86 into data to be entered to a decoding device and processing the data for frame synchronization, and decoding device 88 for performing a repetitive decoding process such as a sum-product decoding process.

The arrangement shown in FIG. 9 may be modified into a data storage apparatus by recording the output from modulator 84 in a recording medium, rather than sending the output to communication path 80, and supplying information read from the recording medium, rather than from communication path 80, to demodulator 86.

As described above, the error correction coding device according to the present invention is capable of meeting a wide range of demands with respect to the code length, the information bit length, and the coding ratio (band increasing ratio) by selecting parameters m, r, n and polynomials.

Since the error correction coding device according to the present invention comprises a plain combination of polynomial multiplying circuits and polynomial dividing circuits, it can be of a simple arrangement, and can reduce the amount of calculations required for coding data and also can reduce the scale of the device. The error correction coding device is also capable of achieving a large coding gain based on repetitive decoding by selecting connections in polynomial multiplying circuits and polynomial dividing circuits. The present invention can thus contribute to an increase in the reliability and a reduction in required electric power of communication systems.

INDUSTRIAL APPLICABILITY

The present invention is applicable as an error correction technology for meeting system requirements for power reduction and small antenna size in satellite or mobile communication systems, or an error correction technology increasing the reliability of storage devices such as magnetic recording storage devices.

The invention claimed is:
1. An error correction coding method using a low-density parity-check code, comprising:
dividing an information bit sequence to be processed for error correction coding, into (m−r) pieces of first blocks each comprising a bit sequence having a length n and r pieces of second blocks comprising respective bit sequences having lengths $k_1, k_2, \ldots, k_r$, where m, n are positive integers, r an integer in a range of $1 \leq r \leq m$, and $k_1, k_2, \ldots, k_r$ integers in a range of $0 \leq k_1, k_2, \ldots, k_r \leq n-1$;

a first arithmetic operation for performing polynomial multiplication on said (m−r) pieces of first blocks, and outputting r pieces of bit sequences having a length n; and a second arithmetic operation for performing a polynomial division and a polynomial multiplication on said r pieces of second blocks and r pieces of operation results of said first arithmetic operation, and outputting a bit sequence including redundant bit sequences having respective lengths n−$k_1$, n−$k_2$, . . . , n−$k_r$.

2. The method according to claim 1, wherein said second arithmetic operation comprises:

a first polynomial dividing and multiplying operation for concurrently performing at most a single polynomial division and at most (r−1) polynomial multiplications on the second block having the length $k_r$ and the r pieces of the operation results from said first arithmetic operation, and outputting (n−$k_r$) bits and (r−1) pieces of bit sequences having the length n of said redundant bit sequences; and a p-th polynomial dividing and multiplying operation, where p is an integer in a range of 2≦p≦r, for concurrently performing at most a single polynomial division and at most (r−p) polynomial multiplications on (r−p+1) pieces of bit sequences having the length n delivered from a (p−1)-th polynomial dividing and multiplying operation and said second block having a length $k_r$−p+1, and outputting (n−$k_{r-p+1}$) bits and (r−p) pieces of bit sequences having the length n of said redundant bit sequences.

3. The method according to claim 2, wherein a divisor in the polynomial dividing operation comprises a quotient polynomial produced by dividing a polynomial $x^n$−1 by a polynomial comprising a product of minimum polynomials on a prime field of elements of a finite field including the n-th root of 1.

4. An error correction coding device using a low-density parity-check code, comprising:

a divider for dividing an information bit sequence to be processed for error correction coding, into (m−r) pieces of first blocks each comprising a bit sequence having a length n and r pieces of second blocks comprising respective bit sequences having lengths $k_1$, $k_2$, . . . , $k_r$, where m, n are positive integers, r an integer in the range of 1≦r≦m, and $k_1$, $k_2$, . . . , $k_r$ integers in the range of 0≦$k_1$, $k_2$, . . . , $k_r$≦n−1;

r pieces of first arithmetic processors for performing polynomial multiplication on said (m−r) pieces of first blocks, and each outputting a bit sequence having a length n as an operation result; and a second arithmetic processor for performing a polynomial division and a polynomial multiplication on said r pieces of second blocks and the operation results respectively supplied in parallel from said r pieces of the first arithmetic processors, and outputting a bit sequence including redundant bit sequences having respective lengths n−$k_1$, n−$k_2$, n−$k_r$.

5. The device according to claim 4, wherein said second arithmetic processor comprises:

a first polynomial dividing and multiplying unit for concurrently performing at most a single polynomial division and at most (r−1) polynomial multiplications on the second block having the length $k_r$ and the operation results from said r pieces of the first arithmetic processors, and outputting (n−$k_r$) bits and (r−1) pieces of bit sequences having the length n of said redundant bit sequences; and a p-th polynomial dividing and multiplying unit, where p is an integer in a range of 2≦p≦r, for concurrently performing at most a single polynomial division and at most (r−p) polynomial multiplications on (r−p+1) pieces of bit sequences having the length n delivered from a (p−1)-th polynomial dividing and multiplying unit and said second block having a length $k_{r-p+1}$, and outputting (n−$k_{r-p+1}$) bits and (r−p) pieces of bit sequences having the length n of said redundant bit sequences.

6. The device according to claim 5, wherein an r-th polynomial dividing and multiplying unit comprises at most a single polynomial dividing circuit and at most (r−q) pieces of polynomial multiplying circuits where q is an integer in a range of 1≦q≦r.

7. The device according to claim 6, wherein said polynomial dividing circuit performs a polynomial division using a divisor which comprises a quotient polynomial produced by dividing a polynomial $x^n$−1 by a polynomial comprising a product of minimum polynomials on a prime field of elements of a finite field including the n-th root of 1.

8. The device according to claim 5, wherein said first arithmetic processor comprises:

a plurality of registers cascade in a plurality of stages; and exclusive-OR circuits connected to respective input ends of the registers in the cascaded connection;

wherein said exclusive-OR circuits have output logic states set by connections determined based on a predetermined polynomial arithmetic operation, such that the output logic state of each of said exclusive-OR circuits is one of non-inverted and inverted.

9. The device according to claim 4, wherein each of said first arithmetic processors comprises:

a plurality of registers cascaded in a plurality of stages; and exclusive-OR circuits connected to respective input ends of the registers in the cascaded connection, wherein said exclusive-OR circuits have output logic states set by connections determined based on a predetermined polynomial arithmetic operation, such that the output logic state of each of said exclusive-OR circuits is one of non-inverted and inverted.

10. A data transmitting apparatus for modulating input data and transmitting the modulated data, comprising an error correction coding device according to claim 4 for performing error correction coding on the input data.

11. The apparatus according to claim 10, wherein said second arithmetic processor comprises:

a first polynomial dividing and multiplying unit for concurrently performing at most a single polynomial division and at most (r−1) polynomial multiplications on the second block having the length $k_r$ and the operation results from said r pieces of the first arithmetic processors, and outputting (n−$k_r$) bits and (r−1) pieces of bit sequences having the length n of said redundant bit sequences; and a p-th polynomial dividing and multiplying unit, where p is an integer in a range of 2≦p≦r, for concurrently performing at most a single polynomial division and at most (r−p) polynomial multiplications on (r−p+1) pieces of bit sequences having the length n delivered from a (p−1)-th polynomial dividing and multiplying unit and said second block having a length $k_{r-p+1}$, and outputting (n−$k_{r-p+1}$) bits and (r−p) pieces of bit sequences having the length n of said redundant bit sequences.

12. The apparatus according to claim 11, wherein an r-th polynomial dividing and multiplying unit comprises at most a single polynomial dividing circuit and at most (r−q) pieces of polynomial multiplying circuits where q is an integer in a range of $1 \leq q \leq r$.

13. The apparatus according to claim 12, wherein said polynomial dividing circuit performs a polynomial division using a divisor which comprises a quotient polynomial produced by dividing a polynomial $x^n-1$ by a polynomial comprising a product of minimum polynomials on a prime field of elements of a finite field including the n-th root of 1.

14. The apparatus according to claim 11, wherein said first arithmetic processor comprises:
   a plurality of registers cascade in a plurality of stages; and
   exclusive-OR circuits connected to respective input ends of the registers in the cascaded connection;
   wherein said exclusive-OR circuits have output logic states set by connections determined based on a predetermined polynomial arithmetic operation, such that the output logic state of each of said exclusive-OR circuits is one of non-inverted and inverted.

15. The apparatus according to claim 10, wherein each of said first arithmetic processors comprises:
   a plurality of registers cascaded in a plurality of stages; and
   exclusive-OR circuits connected to respective input ends of the registers in the cascaded connection,
   wherein said exclusive-OR circuits have output logic states set by connections determined based on a predetermined polynomial arithmetic operation, such that the output logic state of each of said exclusive-OR circuits is one of non-inverted and inverted.

16. A data storage apparatus for modulating input data and recording the modulated data in a recording medium, comprising an error correction coding device according to claim 4 for performing error correction coding on the input data.

17. The apparatus according to claim 16, wherein said second arithmetic processor comprises:
   a first polynomial dividing and multiplying unit for concurrently performing at most a single polynomial division and at most (r−1) polynomial multiplications on the second block having the length $k_r$ and the operation results from said r pieces of the first arithmetic processors, and outputting (n−$k_r$) bits and (r−1) pieces of bit sequences having the length n of said redundant bit sequences; and a p-th polynomial dividing and multiplying unit, where p is an integer in a range of $2 \leq p \leq r$, for concurrently performing at most a single polynomial division and at most (r−p) polynomial multiplications on (r−p+1) pieces of bit sequences having the length n delivered from a (p−1)-th polynomial dividing and multiplying unit and said second block having a length $k_{r-p+1}$, and outputting (n−$k_{r-p+1}$) bits and (r−p) pieces of bit sequences having the length n of said redundant bit sequences.

18. The apparatus of claim 17, wherein an r-th polynomial dividing and multiplying unit comprises at most a single polynomial dividing circuit and at most (r−q) pieces of polynomial multiplying circuits where q is an integer in a range of $1 \leq q \leq r$.

19. The apparatus according to claim 18, wherein said polynomial dividing circuit performs a polynomial division using a divisor which comprises a quotient polynomial produced by dividing a polynomial $x^n-1$ by a polynomial comprising a product of minimum polynomials on a prime field of elements of a finite field including the n-th root of 1.

20. The apparatus according to claim 17, wherein said first arithmetic processor comprises:
   a plurality of registers cascade in a plurality of stages; and
   exclusive-OR circuits connected to respective input ends of the registers in the cascaded connection;
   wherein said exclusive-OR circuits have output logic states set by connections determined based on a predetermined polynomial arithmetic operation, such that the output logic state of each of said exclusive-OR circuits is one of non-inverted and inverted.

21. The apparatus according to claim 16, wherein each of said first arithmetic processors comprises:
   a plurality of registers cascaded in a plurality of stages; and
   exclusive-OR circuits connected to respective input ends of the registers in the cascaded connection,
   wherein said exclusive-OR circuits have output logic states set by connections determined based on a predetermined polynomial arithmetic operation, such that the output logic state of each of said exclusive-OR circuits is one of non-inverted and inverted.

* * * * *

UNITED STATES PATENT AND TRADEMARK OFFICE
CERTIFICATE OF CORRECTION

PATENT NO. : 8,205,142 B2
APPLICATION NO. : 12/300412
DATED : June 19, 2012
INVENTOR(S) : Norifumi Kamiya It is certified that error appears in the above-identified patent and that said Letters Patent is hereby corrected as shown below:

In the Specifications:

Column 9, Line 51: delete "k" and insert -- $k_i$ --

Column 16, Line 29: delete "$g^{(r)}(x$" and insert -- $g^{(r)}(x)$ --

Column 16, Line 45: delete "a" and insert -- $\alpha$ --

Column 17, Line 33: delete " $\Psi^{(2,5)}(x))=x, \Omega^{(2,6)}(x)=1,$ " and insert -- $\Psi^{(2,5)}(x) = x, \Psi^{(2,6)}(x) = 1,$ --

Column 17, Line 34: delete " $\Psi^{(3,5)}(x) x^5,$ " and insert -- $\Psi^{(3,5)}(x) = x^5,$ --

In the Claims:

Column 21, Line 27: In Claim 2, delete "$k_r$-p+1," and insert -- $k_{r-p+1},$ --

Column 21, Line 57: In Claim 4, delete "n-$k_1$, n-$k_2$, n-$k_r$." and insert -- n-$k_1$, n-$k_2$, …, n-$k_r$. --

Column 24, Line 10: In Claim 18, delete "of" and insert -- according to --

Signed and Sealed this
Third Day of September, 2013

Teresa Stanek Rea
*Acting Director of the United States Patent and Trademark Office*